(12) United States Patent
Reiche

(10) Patent No.: US 8,107,322 B2
(45) Date of Patent: Jan. 31, 2012

(54) DEVICE AND METHOD FOR ATTENUATING AN ANTI-RESONANT CIRCUIT

(75) Inventor: Martin Reiche, Weil Der Stadt (DE)

(73) Assignee: Robert Bosch GmbH, Stuttgart (DE)

( * ) Notice: Subject to any disclaimer, the term of this patent is extended or adjusted under 35 U.S.C. 154(b) by 603 days.

(21) Appl. No.: 11/792,600

(22) PCT Filed: Nov. 14, 2005

(86) PCT No.: PCT/EP2005/055939
§ 371 (c)(1),
(2), (4) Date: Apr. 23, 2009

(87) PCT Pub. No.: WO2006/061305
PCT Pub. Date: Jun. 15, 2006

(65) Prior Publication Data
US 2011/0102114 A1 May 5, 2011

(30) Foreign Application Priority Data
Dec. 6, 2004 (DE) .......................... 10 2004 058 665

(51) Int. Cl.
*H03H 7/25* (2006.01)
(52) U.S. Cl. ....................................... 367/135; 367/903
(58) Field of Classification Search .................. 367/903, 367/135
See application file for complete search history.

(56) References Cited

U.S. PATENT DOCUMENTS

| | | | |
|---|---|---|---|
| 5,070,485 A | * | 12/1991 | Nyce .............................. 367/127 |
| 5,199,299 A | | 4/1993 | Hughes et al. |
| 5,267,219 A | | 11/1993 | Woodward et al. |
| 2011/0102114 A1 | * | 5/2011 | Reiche .......................... 333/81 R |

FOREIGN PATENT DOCUMENTS
WO    WO 2006061305 A2 * 6/2006
* cited by examiner

*Primary Examiner* — Daniel Pihulic
(74) *Attorney, Agent, or Firm* — Kenyon & Kenyon LLP

(57) ABSTRACT

A device for the attenuation of an anti-resonant circuit which has a first capacitor and a secondary inductance. A signal is able to be coupled into the anti-resonant circuit via a primary inductance. An attenuator is connected in parallel to a switching device and to the secondary inductance and/or the primary inductanace.

17 Claims, 6 Drawing Sheets

DEVICE AND METHOD FOR ATTENUATING AN ANTI-RESONANT CIRCUIT

FIELD OF THE INVENTION

The present invention relates to a device and a method for attenuating an anti-resonant circuit. Although the present invention is described with reference to an ultrasonic transducer for use in a parking assistance, the invention is not limited thereto.

BACKGROUND INFORMATION

The running time of an ultrasound pulse, for the distance to a preceding vehicle and back, can be measured for the determination of the distance of one vehicle from another vehicle. To accomplish this, the ultrasound transducer generates an ultrasound signal in pulse form. An ultrasound sensor records the reflected components of the ultrasound signal, and a post-connected device determines the running time. From the known speed of sound of approximately 330 m/s and at a distance from the front vehicle of approximately 7.5 cm, there follows an echo time of 0.5 ms.

The ultrasound signal is typically generated by an ultrasound transducer device, in which a piezo actuator actuates a pot diaphragm. A voltage signal having a frequency in the ultrasound range (>20 kHz) and an amplitude in the medium voltage range (10 V-200 V) is applied to a piezo actuator. An electronic wiring configuration of such an ultrasound transformer device 5 is shown, with reference to FIG. 6. A current source 2 generates a transmitting current 1 (signal), which is transmitted inductively via a primary inductance 4a of a transformer device 4 to a secondary inductance 4b. In this context, transmitting current 1 is shifted by switch 3 which, after a transmitting excitation, transfers into a high-resistance center position. Secondary inductance 4b, together with the ultrasound transducer device and its electrical capacitance, forms an anti-resonant circuit having an electrical resonant frequency. The electrical resonant frequency is in the ultrasound range. In order to achieve an optimal excitation of the piezo actuator, the electrical resonant frequency is tuned to the mechanical resonant frequency of sound transducer device 5.

Sound transducer device 5 is used not only for transmitting acoustical ultrasound signals 11 but also for receiving reflected component 12 of ultrasound signal 11. Received reflected ultrasound signal 12 is converted to a voltage level by the sound transducer device 5, and is amplified via an amplifier device having an operational amplifier 6 and output as output signal 10.

The component of reflected ultrasound signal 12 of transmitted ultrasound signal 11 is very small. Accordingly, only very low voltage levels come about during the conversion of the reflected ultrasound signal by the sound transducer device. These are typically in a range of a few 10 µV at the amplifier input. In order to be able to record these signals, it is necessary for the voltage amplitude of the oscillation in the anti-resonant circuit to have fallen to a lower level than the voltage potential of the received signals, during transmission of ultrasound pulse 11. To achieve this, a sufficiently strong attenuation of the anti-resonant circuit is required. Attenuation takes place via a resistor $R_1$, which is connected to the inverting input of the operational amplifier. As long as operational amplifier 6 is not driven to saturation by the signal amplitude of the anti-resonant circuit, attenuation of the anti-resonant circuit comes about which is proportional to resistor $R_1$ and the voltage amplitude of the oscillation in the anti-resonant circuit, because a current is flowing into the virtual ground at the inverting input of operational amplifier 6. In the case of a typical amplification of the feedback operational amplifier circuit of 10, supply voltages of the operational amplifier of 0 and 5 Volt and a biasing voltage equal to one-half the supply voltage (2.5 V) at the non-inverting input of the operational amplifier, a saturation of the operational amplifier takes place at the latest in response to a signal having an amplitude of 250 mV. The saturation starts correspondingly earlier if the maximum modulation level of the operational amplifier is lower than the supply voltage.

An inverting input of operational amplifier 6 is typically connected via damping diodes $D_3$ and $D_4$ to a ground potential Gnd and $V_{DD}$ in the blocking direction. In addition, the anti-resonant circuit is connected to the operational amplifier via a capacitor $C_1$, in order to achieve isolation of the DC voltage levels. For signal amplitudes of the anti-resonant circuit whose amount is greater than the sum of one-half the supply voltage $V_{DD/2}$ (2.5 V) and the voltage drop over diodes $D_3$ and $D_4$ (0.6 V), there comes about a current flow to supply potential $V_{DD}$ and ground potential Gnd via resistor $R_1$. For large amplitudes, in the previous example, for amplitudes amounting to 3.1 V, an attenuation comes about in this way for the anti-resonant circuit which is proportional to the amplitude of the signal in the anti-resonant circuit and proportional to resistor $R_1$. For signal amplitudes in the range between 0.25 V and 3.1 V, however, there is no attenuation that is a linear function of the signal amplitude in the anti-resonant circuit, because, on the one hand, the clamping diodes do not conduct yet, and on the other hand, the operational amplifier is in saturation.

Instead of a clamping of the inverting input of the operational amplifier using diodes, a pair of transistors of two types of conductivity can be used in a push-pull configuration. In this context, the emitter-collector path of the one transistor connects ground to the inverting input and the emitter-collector path of the other transistor connects the supply voltage to the inverting input. Half the supply voltage is present at the base of the transistors. Because of that, one of the two transistors switches to conductive when the amount of the signal amplitude becomes greater than 0.6 V. There comes about, in this instant, a non-linear, attenuated range of 0.25 V to 0.6 V.

SUMMARY

According to the present invention, a device is provided for attenuating an anti-resonant circuit having a secondary inductance and a first capacitor, a signal being able to be inductively coupled into the secondary inductance via a primary inductance. An attenuator having a switching arrangement is connected in parallel to the primary and/or the secondary inductance of the transformer.

One advantage of the present invention is that a damping that is a linear function of the signal amplitude is achieved over the entire voltage range of a signal amplitude.

One example method according to the present invention provides switching the switching device into a conductive state when the signal is to be attenuated.

One advantage of the example method according to the present invention is that, at a specified point in time, an attenuation sets in by the switching device being switched into a conductive state, and at other times the anti-resonant circuit is not attenuated. This is especially advantageous for a sound transducer device that emits at maximum amplitude and is then attenuated in order to achieve a rapid drop in the signal amplitude, and after that is available to receive a reflected sound signal.

According to one preferred refinement, the primary inductance is connected to a current source via a switching element. Thus, in an advantageous manner, the current source can additionally be decoupled for the attenuation of the anti-resonant circuit. During the reception of signals by the sound transducer device, the current source is normally decoupled.

According to another refinement, a node between the anti-resonant circuit and the switching device is connected to an inverting input of an operational amplifier. Reflected ultrasound signals which couple into the sound transducer device may consequently be supplied to an amplification device.

According to a further refinement, a capacitor connects the anti-resonant circuit to the inverting input of the operational amplifier. This makes possible an equisignal decoupling between the operational amplifier and the anti-resonant circuit.

According to one further development, a first transistor between the node and a first potential is situated in the switching device, and a second transistor is situated between the node and a first ground potential. In addition, the control inputs of the two transistors are connected to a signal output of the operational amplifier. Advantageously, the output signal of the operational amplifier, which is formed by an amplification of the signal, in this way controls the potential present at the base of the transistors. One of the two transistors becomes conductive when the input signal times the effective amplification of the operational amplifier circuit is greater than the threshold voltage of one of the two transistors. In this way, a damping via the attenuator can be achieved for small signal amplitudes.

According to another refinement, a switching device is situated between control inputs of the two transistors and the signal output of the operational amplifier. This makes possible switching on and off the attenuation of the signal.

According to another refinement, a voltage divider is situated between control inputs of the two transistors and the signal output of the operational amplifier. This makes possible an adjustment of the minimum voltage level, for which an attenuation is to set in, independently of the amplification of the operational amplifier circuit.

A device according to the present invention for attenuating an anti-resonant circuit having a secondary inductance and a first capacitor, a signal being able to be inductively coupled into the secondary inductance via a primary inductance, has an attenuator having a passive switching device, which is connected in parallel to the secondary inductance. For signals which exceed the threshold voltage of the diodes, attenuation is advantageously achieved. In one advantageous application of Schottky diodes, damping can consequently be achieved beginning at 0.2 V.

According to still another refinement, a node between the attenuator and the passive switching device is connected to the coupling capacitor, and thus DC potential GND. This is the DC potential of sound transducer device 5. Thus, the damping takes place against a low-resistance potential GND having a negligible internal resistance, instead of against a reference potential OP that dose not have a negligible internal resistance (V_dd/2) and has possible coupling effects in additional parts of the wiring (V_dd/2 becomes VERZOGEN, (distorted?), resonating of additional amplifier stages having the same reference potential).

BRIEF DESCRIPTION OF THE DRAWINGS

Exemplary embodiments of the present invention, as well as advantageous further refinements, are shown in the figures and are explained in greater detail below.

DETAILED DESCRIPTION OF THE EXEMPLARY EMBODIMENTS

Figure 1:
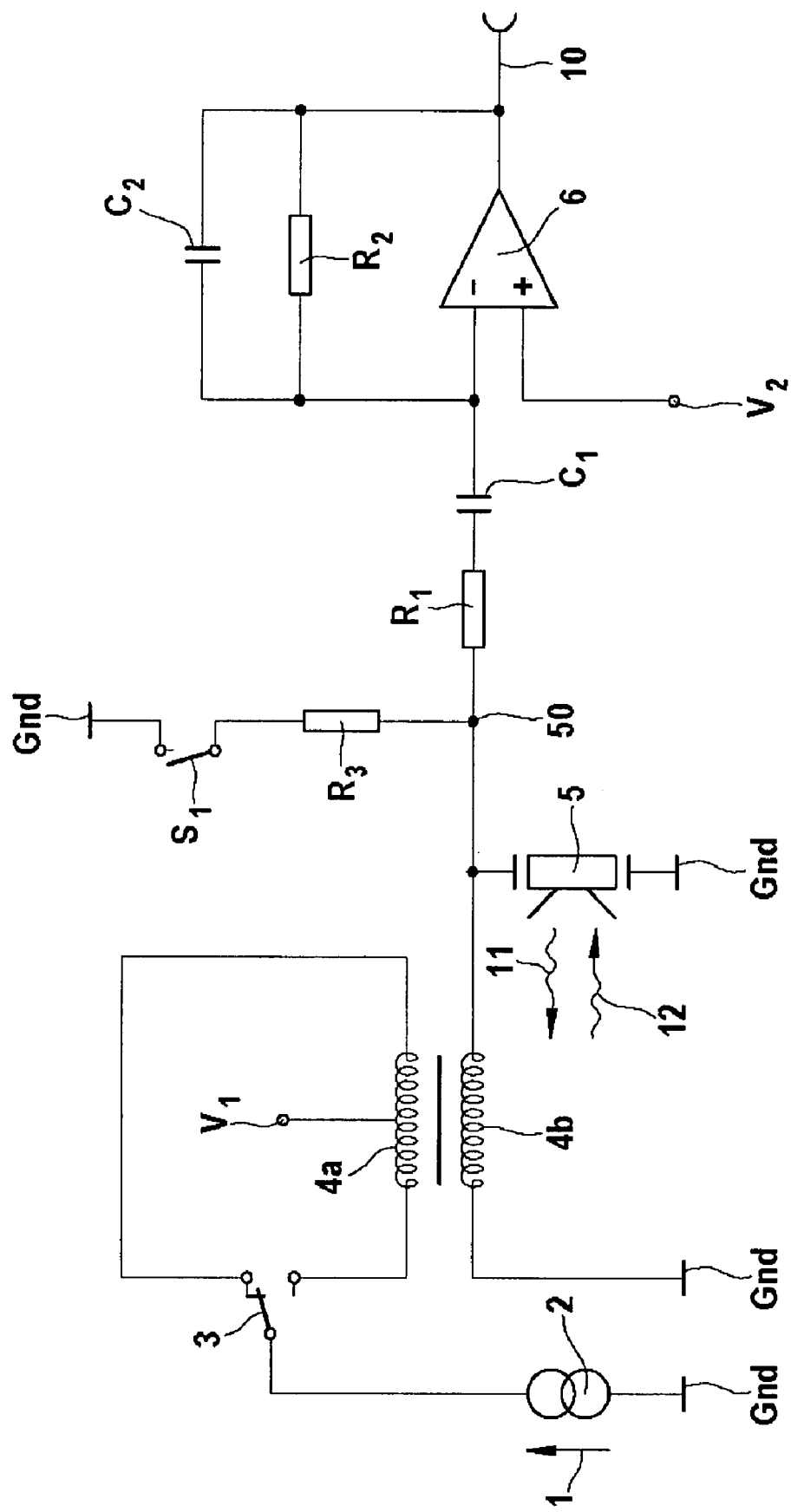
FIG. 1 shows a schematic representation of a first specific example embodiment of the present invention.

In the figures, like reference numerals designate like or functionally similar components, unless otherwise specified.

FIG. 1 shows a schematic representation of a first specific example embodiment of the present invention. A sound transducer device 5 is used for transmitting ultrasound signals 11 and for receiving reflected ultrasound signals 12. The ultrasound signals 11 are preferably transmitted as pulses. By recording the time span which a transmitted ultrasound signal 11 requires until it is received as a reflected ultrasound signal 12, the distance from the object can be determined at which ultrasound signal 11 was reflected. This may be used in parking assistance for vehicles, among other purposes. Because of the speed of sound of approximately 330 m/s, a running time of approximately one ms comes about for a distance of 15 cm of the sound transducer device from the object.

Sound transducer device 5 can be formed by a pot diaphragm which is moved by a piezo actuator. The piezo actuator, as a good approximation in an electrical equivalent circuit diagram, corresponds to a capacitor. The mechanical properties of the pot diaphragm, such as its rigidity, mass and mechanical damping, determine the resonant frequency and the decay behavior of the sound transducer device. Its behavior can be modeled in the equivalent circuit diagram as a series circuit connected in parallel to the capacitor, made of a resistor, a capacitor and an inductance.

Sound transducer device 5 is connected in parallel to a secondary inductance 4b. Inductance 4b and capacitor 5 of sound transducer device 5 form an anti-resonant circuit, in this way. The self-resonance of this anti-resonant circuit is preferably adjusted in such a way that it corresponds to the mechanical self-resonance of sound transducer device 5. In this way, a maximum deflection amplitude of the pot diaphragm is reached, and consequently, a maximum sound pressure is generated. In this context, it should be observed that sound transducer device 5 is designed in such a way that its self-resonances lie in the ultrasound range.

A signal 1 is coupled into secondary inductance 4b via a primary inductance 4a. The secondary and the primary inductances together are able to form a transformer 4. This makes possible an overvoltage of signal 1 that is coupled in from the primary side to the secondary side of transformer 4. Signal 1 is made available by a current source 2 which can be connected to primary inductance 4a via a switching element 3, for instance, a change-over switch.

In order to measure the echo time of ultrasound signals 11, reflected ultrasound signals 12 is recorded. Sound transducer device 5 converts reflected ultrasound signals 12 to a voltage signal. Since, however, only a small proportion of transmitted ultrasound signals 11 is reflected, the corresponding voltage signal is very low. A typical order of magnitude of these voltage signals is in the range of a few μV. On the other hand, the signal amplitudes in the anti-resonant circuit, which are used to excite the pot diaphragm, are in the range of 10 V-200 V, or greater. From this it follows that it is possible to attenuate the voltage amplitude in the anti-resonant circuit from secondary inductance 4b and sound transducer device 5 to a voltage level that is less than a few μV. Consequently, an attenuation of more than 140 dB is achieved. The time span within which the attenuation is achieved is given by the echo time of ultrasound signals 11 to the reflecting object and back to sound transducer device 5, typically in the range of approximately 1 ms, commensurate with a close-range measuring capability of 20 cm.

A purely mechanical damping of the pot diaphragm, for the purpose of achieving appropriate decay times, is not desired, since this runs counter to a high transmission sound pressure of sound transducer device 5. In addition, this damping would act permanently, and reflected ultrasound signals 12 would also be weakened by the mechanical damping. In the first specific embodiment it is provided that the anti-resonant circuit, made up of secondary inductance 4b and the capacitor of sound transducer device 5, is attenuated by attenuators $R_1$ and $R_2$. These two attenuators $R_1$, $R_2$ are able to have resistances. Attenuator $R_3$ forms a series circuit with switching device S, which is connected in parallel to secondary inductance 4b. In the representation in FIG. 1, the parallel connection is made via ground potential Gnd. If switching device $S_1$ is connected in a conducting manner, a current flows through attenuator $R_3$ and a corresponding power is dissipated in attenuator $R_3$. Using a suitable selection of the resistance of attenuator $R_3$, a damping of more than 140 dB can be reached within a few ms.

During the receiving of ultrasound signals 12 by sound transducer device 5, switching device $S_1$ is in the blocking state. In this instance, attenuation of the signal takes place only by the current flow into the virtual ground via resistor $R_1$, which connects sound transducer device 5 to the inverting input of operational amplifier 6. This attenuation is advantageously held low for receiving and transmitting ultrasound signals by using an attenuator $R_1$ having a high resistance. Consequently, the signal are attenuated only a little. A maximum sound pressure of ultrasound signal 11 can be achieved when transmitting, in the same manner.

Attenuator $R_1$ connects the anti-resonant circuit, made up of secondary inductance 4b and sound transducer device 5, to the inverting input of an operational amplifier 6. Operational amplifier 6 has feedback using a resistor $R_2$ and a capacitor $C_2$. This makes possible amplifying received ultrasound signals 12 and their corresponding voltage levels by the operational amplifier circuit made up of operational amplifier 6, attenuator $R_1$, which now functions as a series resistor, and the feedback, and outputting them as output signal 10.

An additional specific embodiment provides using a non-inverting operational amplifying circuit having a very high input resistance. In this context, the input of the operational amplifier is connected to the ground potential and the anti-resonant circuit via a resistor.

Figure 2:
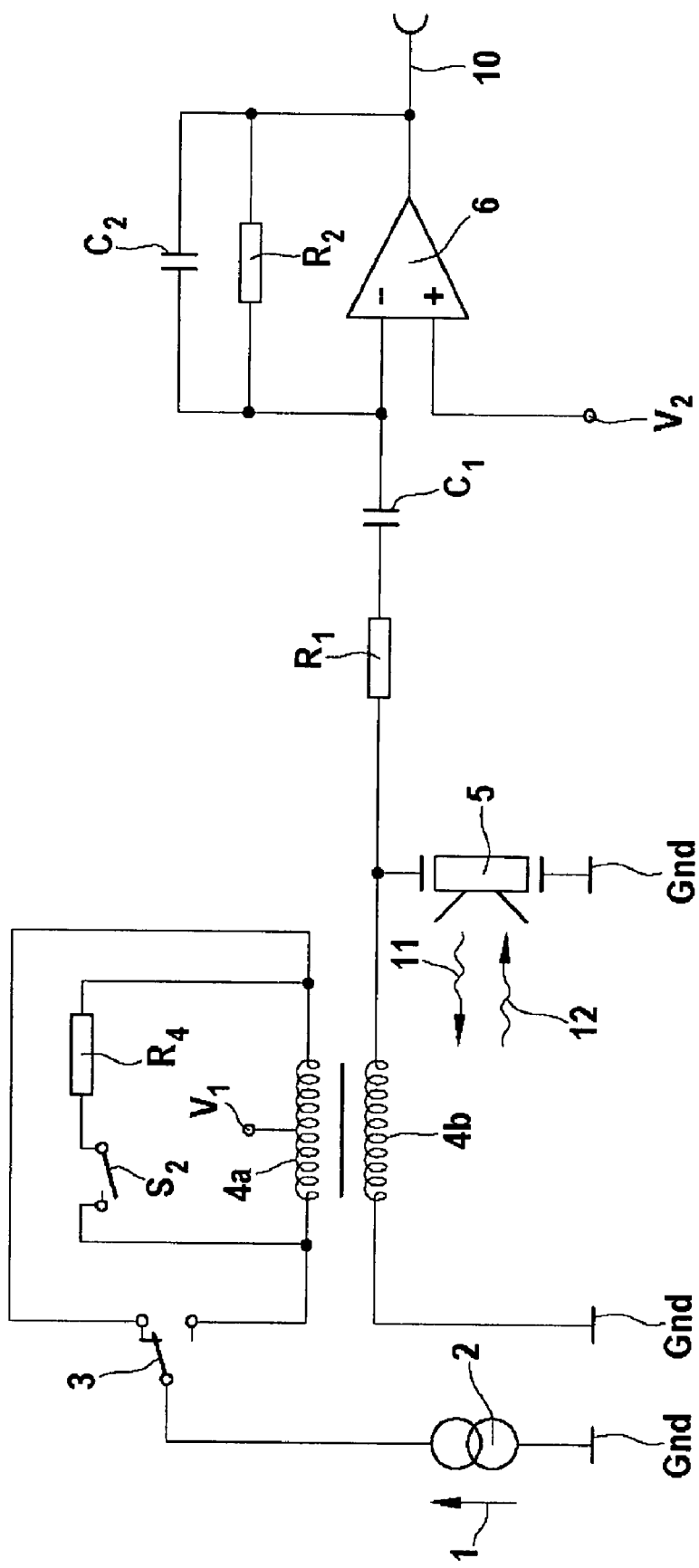
FIG. 2 shows a schematic representation of a second specific example embodiment of the present invention.

FIG. 2 shows a second specific embodiment of the present invention. In contrast to the first specific embodiment, a series circuit is connected in this case of an attenuator $R_4$ and a switching device $S_2$ parallel to primary inductance 4a. In the conducting connected state of switching device $S_2$, power is dissipated in attenuator $R_4$ (in the drawing, by mistake also R2 instead of R4!, that is withdrawn from the anti-resonant circuit of secondary inductance 4b and sound transducer device 5. In order to achieve an attenuation with the aid of attenuator $R_4$ which corresponds to the attenuation by attenuator $R_4$ of the first specific embodiment, one takes into consideration the transforming ratio N of transformer 4, made up of primary inductance 4a and secondary inductance 4b. A factor of $1/N^2$ comes about in this instance.

Figure 3:
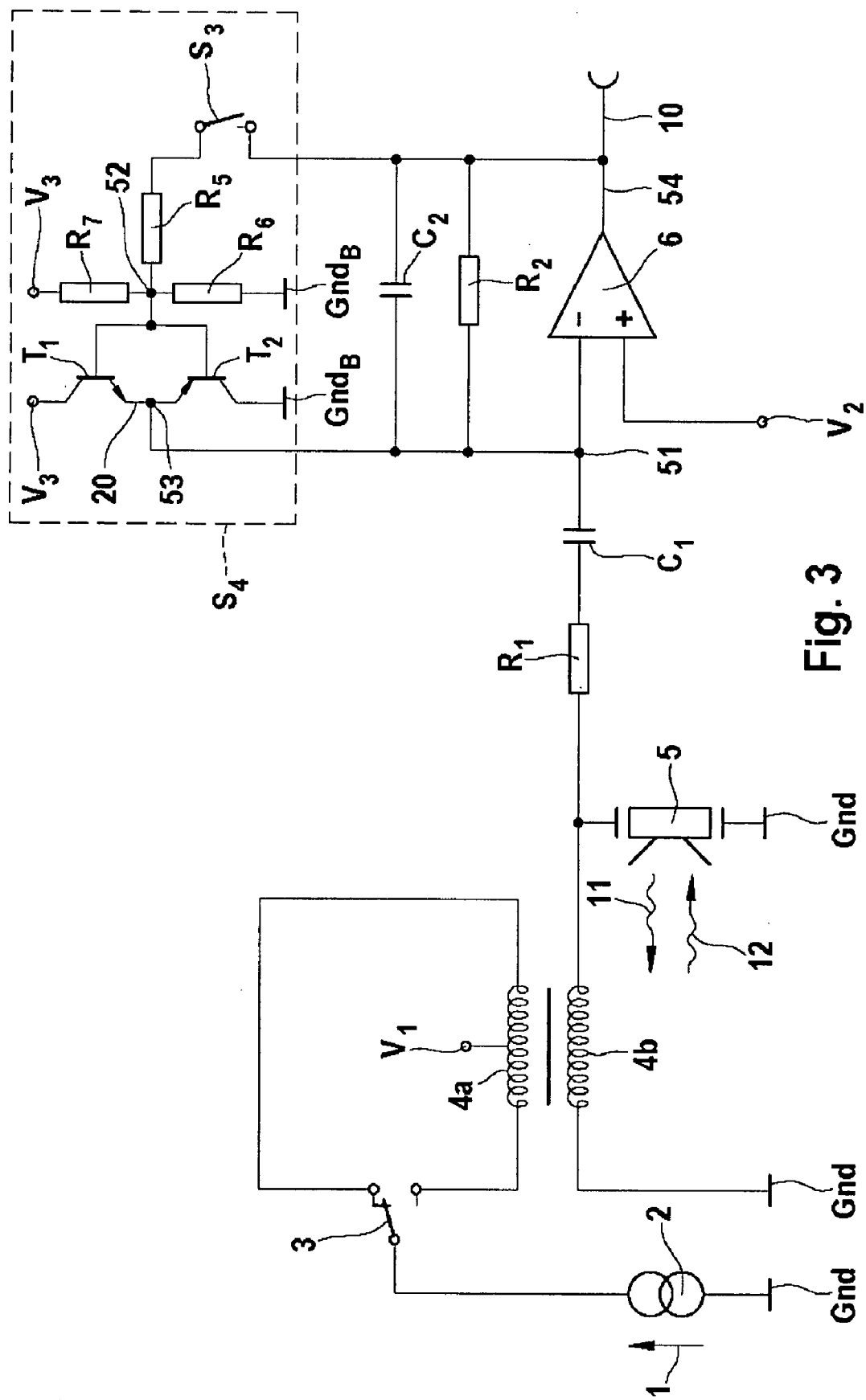
FIG. 3 shows a third specific example embodiment of the present invention.

FIG. 3 shows a second specific embodiment of the present invention. A first transistor $T_1$ is connected by its collector to a first voltage potential $V_3$, which may be, for instance, supply voltage potential $V_{DD}$ of operational amplifier 6. Transistor $T_1$ is of a first conductivity type. Transistor $T_1$ may be a bipolar or a field effect transistor. A transistor $T_2$ of a second conductivity type is connected by its collector to a second ground potential $Gnd_B$, to which a supply line of operational amplifier 6 may be connected. The emitters of the two transistors $T_1$ and $T_2$ are both connected to an inverting input of operational amplifier 6. If a signal is present at the inverting input of operational amplifier 6, whose potential is greater by at least one threshold value voltage of transistor $T_2$ than the potential that is present at the base of Transistor $T_2$, transistor $T_2$ switches to the conducting state and connects the inverting input of operational amplifier 6 to second ground potential $Gnd_B$. In an analogous manner, transistor $T_1$ switches to conducting if the potential of an inverting input of operational amplifier 6 is less than the potential present at the base of transistor $T_1$ by at least one threshold voltage value of transistor $T_1$. In this case, the inverting input of operational amplifier 6 is connected to first voltage potential $V_3$ The minimum voltage amount which is thus required so that a current flows off through attenuator $R_1$ to ground potential $Gnd_B$, or to first supply potential $V_3$, can be controlled by the threshold value voltage of the transistors and the potential which is present at the base of the two transistors $T_1$ and $T_2$. The two bases of the transistors are connected to the output signal of feedback operational amplifier 6. Consequently, an amplified inverted input signal is present at the base of the transistors which is present at the inverting input of operational amplifier 6. Thus, in response to a signal of 50 mV at the inverting input of the operational amplifier, and an exemplary amplification of 10, there comes about a base potential of −500 mV at transistor $T_2$. If the threshold voltage value of transistor $T_2$ is, for instance, 550 mV, transistor $T_2$ switches into the conducting state. In an analogous manner, transistor $T_1$ switches into the conducting state if the signal at the inverting input of operational amplifier 6 amounts to −50 mV. From this it follows that, beginning at a voltage amplitude of 50 mV, a current flows through attenuator $R_1$, and then the anti-resonant circuit having secondary inductance 4b and sound transducer device 5 is attenuated. For voltage amplitudes that are less than 50 mV, attenuation is achieved by the feedback through operational amplifier 6. In this case, the inverting input of operational amplifier 6 can be regarded as virtual ground.

In the signal path between the base of transistors $T_1$ and $T_2$ and the output of operational amplifier 6, there may be situated a switching device $S_3$. This makes it possible to switch on and off the attenuation.

The direct voltage potential of operational amplifier 6 is decoupled from the direct voltage potential of the anti-resonant circuit by a capacitor $C_1$.

A node 52 of a voltage divider made of two resistors $R_6$ and $R_7$ is connected to the base of transistors $T_1$ and $T_2$. The voltage divider connects supply voltage $V_3$ to ground potential $Gnd_B$. Resistors $R_6$ and $R_7$ are advantageously picked to be of the same value.

In the signal path between the output of operational amplifier 6 and node 52, a second voltage divider is formed by a resistor $R_5$ with resistors $R_6$ and $R_7$. This second voltage divider makes possible an adjustment of the output signals of operational amplifier 6 independently of the selected amplification of the operational amplification circuit, made up of input resistor $R_1$, feedback resistor $R_2$ and operational amplifier 6.

Figure 4:
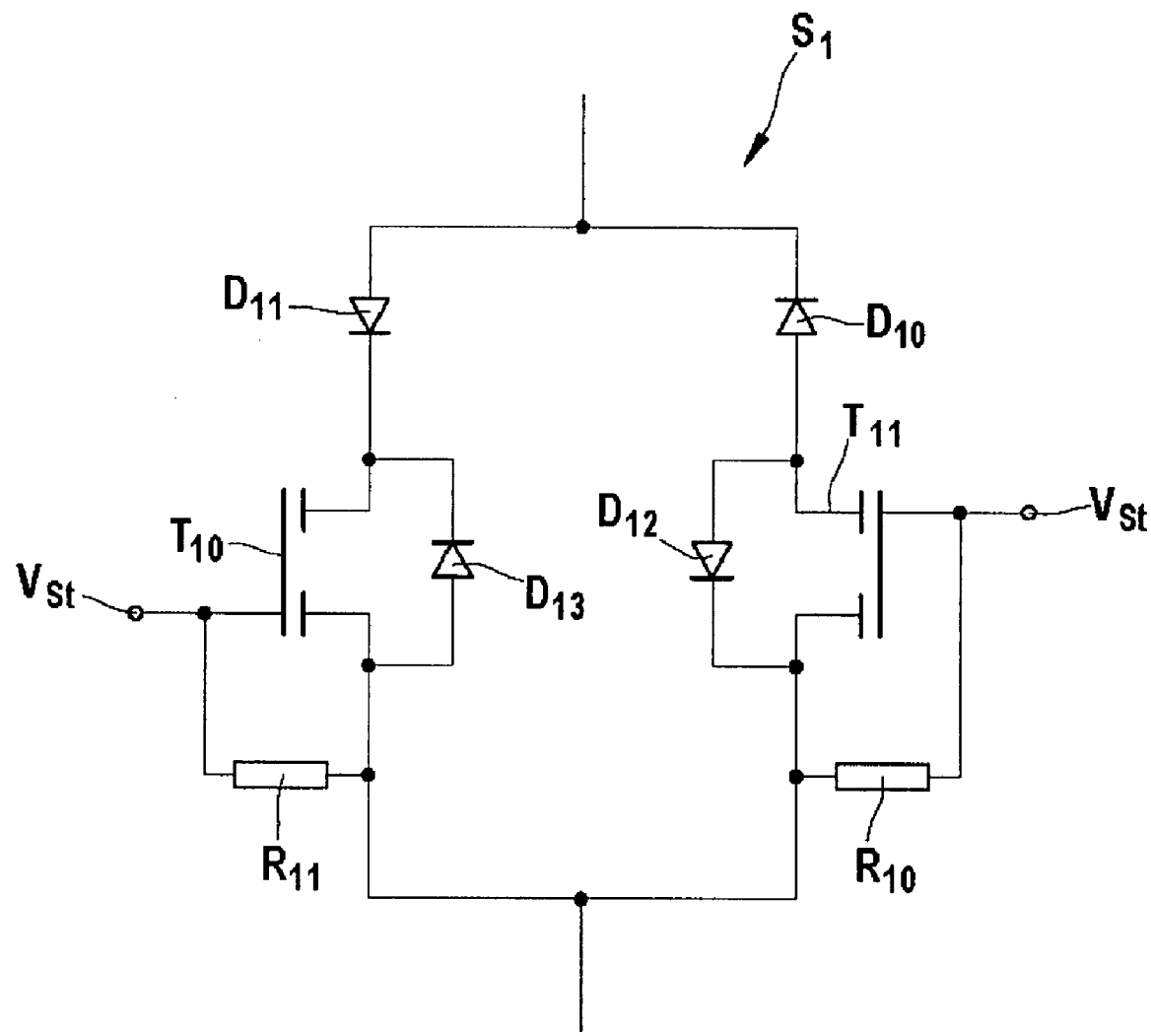
FIG. 4 shows a schematic representation of a switching device for one of the specific embodiments of the present invention.

FIG. 4 shows a schematic representation of a switching device $S_1$ for one of the specific embodiments. The switching device is made up of two signal paths connected on both sides to each other and situated in an antiparallel manner. In this context, a signal path has a diode, a transistor, for instance, a field effect transistor. An external control signal $V_{St}$ can be applied to the field effect transistor. For a first half wave, the first signal path is connected in a conducting manner and for a second half wave, the second signal path is connected in a conducting manner, if an appropriate control signal $V_{St}$ is present at the two transistors $T_{10}$ and $T_{11}$. One may do without diodes $D_{10}$, $D_{11}$ if the transistors have no internal protective diodes $D_{12}$, $D_{13}$.

Figure 5:
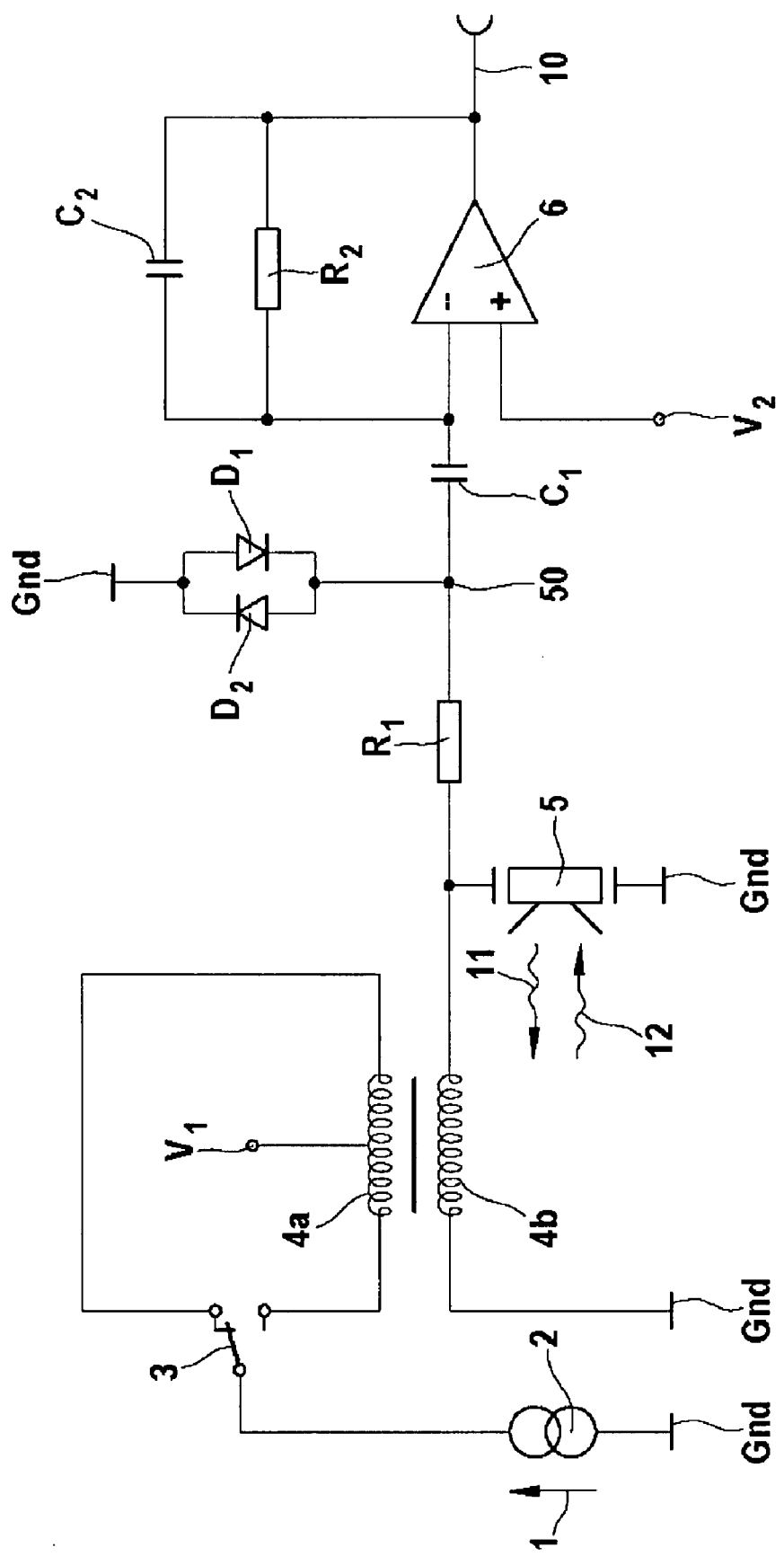
FIG. 5 shows a fourth specific example embodiment of the present invention
Figure 6:
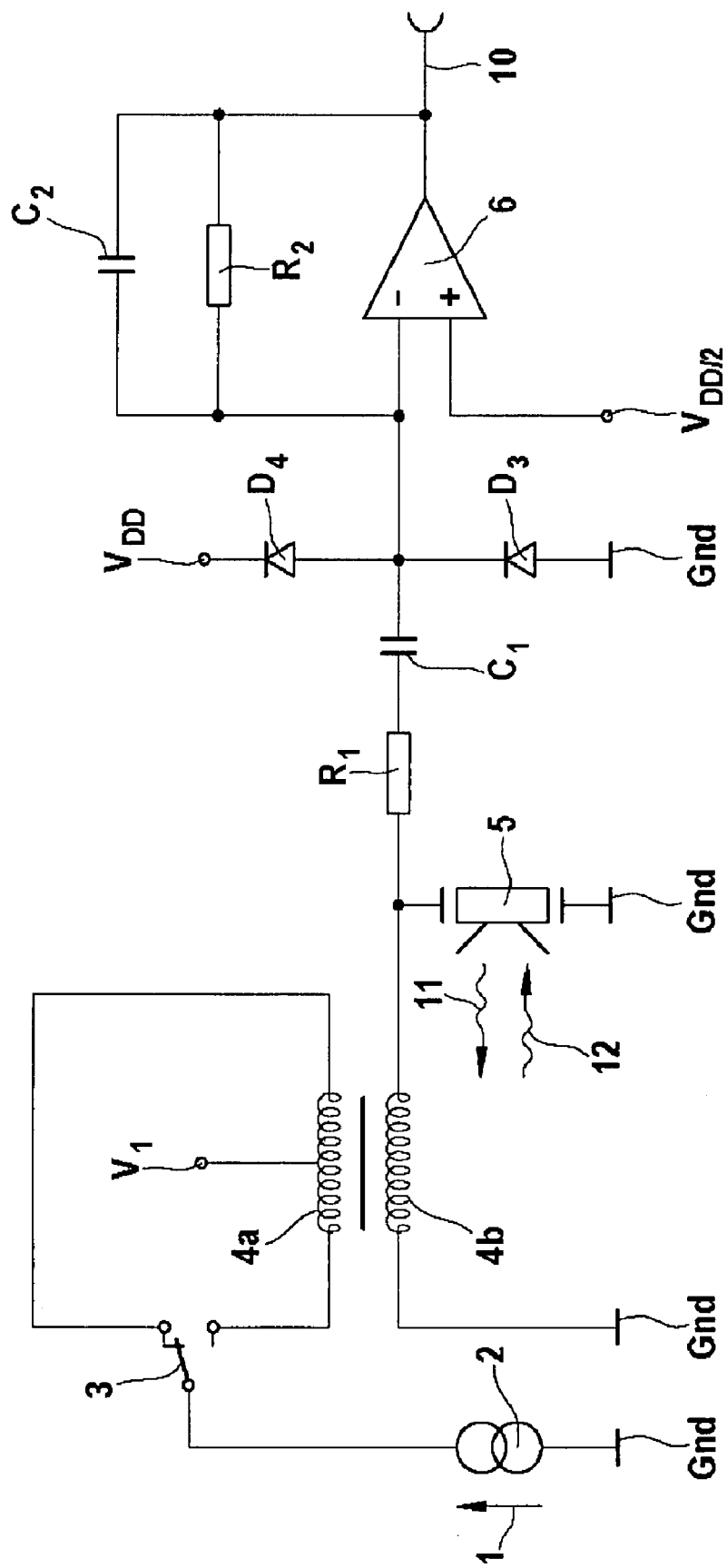
FIG. 6 shows a schematic representation for explaining an object of the present invention.

FIG. 5 schematically shows a fourth form of the present invention. Parallel to secondary inductance 4b, a series circuit made up of an attenuator $R_1$ and a parallel connection of two diodes $D_1$ and $D_2$ connected in an antiparallel fashion is connected. The two diodes $D_1$ and $D_2$ are preferably Schottky diodes. Since these have a very low threshold voltage of typically 0.2 V, an attenuation of the anti-resonant circuit comes about for signal amplitudes that are greater than 0.2 V. An attenuation for signal amplitudes that are less than 0.2 V can be achieved through the inverted input of feedback operational amplifier 6. This brings about an attenuation that is to a great extent linear, of the anti-resonant circuit having secondary inductance 4b and sound transducer device 5. The expenditure required from a circuit technology point of view, because of the additional Schottky diodes, is advantageously very low. Consequently, this makes possible a cost-effective variant for an improved attenuation of the anti-resonant circuit. This damping treatment is, however, also effective during the transmission procedure, since it is not switched.

Although the present invention was described above in terms of preferred exemplary embodiments, it is not limited to them, but rather is modifiable in numerous ways.

In this connection, in place of a sound transducer device 5, another resonantly driven capacitive device can be situated which is excited resonantly and is to be strongly attenuated in the shortest time possible. One might well think here, among other things, of sensors for sonar measurements.

What is claimed is:

1. A device for attenuating an anti-resonant circuit having a secondary inductance and a first capacitor comprising:
   a primary inductance adapted to inductively couple a signal into the secondary inductance; and
   an attenuator having a switching device, the attenuator connected is parallel to at least one of the primary inductance and the secondary inductance,
   wherein a node between the anti-resonant circuit and the switching device is connected to an inverting input of an operational amplifier, and wherein, in the switching device, a first transistor is situated between the node and a first potential, and a second transistor is situated between the node and a first ground potential, and wherein the control inputs of the first transistor and the second transistor are connected to a signal output of the operational amplifier.

2. The device as recited in claim 1, wherein the switching device is adapted to be switched using an external switching signal.

3. The device as recited in claim 1, wherein the primary inductance is connected to a current source via a switching element.

4. The device as recited in claim 1, wherein the anti-resonant circuit is connected to an inverting input of the operational amplifier via a capacitor.

5. The device as recited in claim 1, wherein a switching device is situated between the control inputs of the first transistor and the second transistor and the signal—output of the operational amplifier.

6. The device as recited in claim 1, wherein a voltage divider is situated between the control inputs of the first transistor and the second transistor, and the signal output of the operational amplifier.

7. The device as recited in claim 1, wherein the capacitor is a capacitor of a sound transducer device.

8. The device as recited in claim 1, wherein the switching devices includes a transistor.

9. The device as recited in claim 1, wherein the switching device includes a passive switching device.

10. The device as recited in claim 9, wherein the passive switching device includes two anti-connected diodes which are connected in series with the attenuator.

11. The device as recited in claim 9, wherein the attenuator includes a resistor and Schottky diodes.

12. The device as recited in claim 9, wherein a node between the attenuator and the passive switching device is connected to an inverting input of an operational amplifier.

13. A method for attenuating an anti-resonant circuit having a secondary inductance and a first capacitor, wherein a signal is inductively coupled into the secondary inductance via a primary inductance, and wherein a series circuit, including an attenuator and a switching device is situated in parallel to at least one of the primary inductance and the secondary inductance, the method comprising:
   switching the switching device into a conducting state if the signal is to be attenuated,
   wherein a node between the anti-resonant circuit and the switching device is connected to an inverting input of an operational amplifier, and wherein, in the switching device, a first transistor is situated between the node and a first potential, and a second transistor is situated between the node and a first ground potential; and wherein the control inputs of the first transistor and the second transistor are connected to a signal output of the operational amplifier.

14. The device as recited in claim 1, wherein the switching device is adapted to be switched using an external switching signal, wherein the primary inductance is connected to a current source via a switching element, and wherein the anti-resonant circuit is connected to an inverting input of the operational amplifier via a capacitor.

15. The device as recited in claim 14, wherein a switching device is situated between the control inputs of the first transistor and the second transistor and the signal—output of the operational amplifier.

16. The device as recited in claim 14, wherein a voltage divider is situated between the control inputs of the first transistor and the second transistor, and the signal output of the operational amplifier.

17. The device as recited in claim 14, wherein the capacitor is a capacitor of a sound transducer device, wherein the switching device includes a passive switching device, wherein the passive switching device includes two anti-connected diodes which are connected in series with the attenuator, and wherein the attenuator includes a resistor and Schottky diodes, and wherein a node between the attenuator and the passive switching device is connected to an inverting input of an operational amplifier.

* * * * *